July 7, 1970 H. R. CAMEZIND 3,519,946

CLASS A AUDIO AMPLIFIER

Filed Sept. 30, 1968 2 Sheets-Sheet 1

INVENTOR
HANS R. CAMENZIND
BY Charles W. Hoffmann
ATTORNEY

CLASS A AUDIO AMPLIFIER

Filed Sept. 30, 1968 2 Sheets-Sheet 2

INVENTOR
HANS R. CAMENZIND
BY Charles W. Hoffman
ATTORNEY 3,519,946
CLASS A AUDIO AMPLIFIER
Hans R. Camezind, 862 Springer Road,
Los Altos, Calif. 94022
Filed Sept. 30, 1968, Ser. No. 763,605
Int. Cl. H03g 3/30
U.S. Cl. 330—24 3 Claims

ABSTRACT OF THE DISCLOSURE

A Class A audio amplifier including a driver amplifier and a power amplifier. The driver amplifier includes an amplifying semiconductive means and diode means. The amplifying semiconductor means and the diode means co-operate to provide a diode biased output stage having a gain inversely proportional to the gain of the power stage. The Class A audio amplifier further includes a negative feedback network which feeds back part of the output signal to the input of the audio amplifier.

The present invention generally relates to an amplifier and in particular to a Class A audio amplifier including an integrated circuit driver amplifier and a power amplifier.

Integrated circuits is an art in which a continuous substrate includes a plurality of interconnected active and passive elements inseparably associated on or within the substrate which are utilized to provide circuit functions which usually require a plurality of separate active and passive components. Thus, an integrated circuit provides the circuit functions of several individual active and passive elements. For example, the active elements of the integrated circuit control voltages or currents to produce amplification or switching in the circuit. An example of an active element is a transistor. The passive components of an integrated circuit are inert elements such as resistors, capacitors and the like, which may control, but which do not switch or amplify voltages or currents.

In integrated circuits, conventional circuit components such as transistors, resistors, capacitors and the like may be fabricated on or within a monocrystalline body of a semiconductive material such as silicon, germanium and the like. The attractive features of integrated circuit devices are that the integrated devices may be produced on a large scale by mass production techniques and that the mass produced circuits are inherently more reliable than conventionally connected circuits because of the elimination of soldered interconnections between the several elements of the circuit.

Integrated circuits have had wide acceptance in amplifying devices because of their significant cost reduction in design and fabrication so that they are more nearly competitive in price to the conventionally fabricated amplifying circuits. An amplifier is a device which draws power from a source other than the input signal and which produces as an output signal an enlarged reproduction of the essential features of the input signal. Amplifying circuits may be classified by operating conditions which refer to the portion of each cycle of the input signal during which output current is present at the output of the amplifier. In a Class A amplifier, current appears at the output terminals at all times. In a Class B amplifier, current appears at the output terminals during less than one-half of each cycle of the input signal. There are other types of classifications of amplifiers, however, these refinements of classification do not seem to be relevant to the discussion of the amplifier of the instant application.

In Class A audio amplifiers, one of the most often used means for amplifying the power of the audio signal includes biasing an active element such as a transistor in the center of its useful current region and thereafter varying the current of the transistor with an audio signal. However, when transistors are used with conventional interconnections to provide a Class A audio amplifier several problems are manifest. Generally, transistors suitable for use in amplifiers have a gain within a wide range, thus an adjustment in the circuit must be made for each transistor to bring its quiescent current to the required level for satisfactory operation. In addition, the gain of transistors used as amplifiers reaches a maximum at some current dependent on the characteristics of the cooperatively associated elements and the characteristics of the transistor, and the gain declines as the current increases. The behavior of transistors under this condition causes undesirable distortion of the output signal. To reduce the distortion of the output signal, a large amount of negative feedback is typically used, which reduces both the efficiency and the gain of amplifier.

Accordingly, it is an object of the present invention to provide a Class A audio amplifier including an integrated circuit driver amplifier which overcomes the problems discussed hereinabove.

Another object of the present invention is to provide a Class A audio amplifier which has greater versatility than several of the prior art Class A audio amplifiers.

Yet another object of the present invention is to provide an integrated circuit driver amplifier having an output stage wherein the gain thereof is inversely proportional to the current gain of a power stage connected to the integrated circuit driver amplifier.

A further object of the present invention is to provide a Class A audio amplifier having an integrated driver amplifier which has diode means in the emitter circuit of an output transistor thereby rendering the total circuit gain of the audio amplifier substantially independent of the beta spreads of various power transistors associated with the Class A audio amplifier.

Another object of the present invention is to provide a Class A audio amplifier including an integrated circuit driver amplifier which is designed to drive a single ended PNP germanium power output device of the Class A audio amplifier.

Yet another object of the present invention is to provide a Class A audio amplifier including an integrated circuit driver amplifier wherein the output of the driver amplifier is connected directly to the base of an output device and negative feedback from the collector of the output device is applied to the input of the driver amplifier.

Yet still another object of the present invention is to provide a linear Class A audio amplifier including an integrated circuit driver amplifier.

A further object of the present invention is to provide a linear Class A audio amplifier including an integrated circuit driver amplifier having a high input impedance to minimize the distortion of the input signal.

Another object of the present invention is to provide a linear Class A audio amplifier having a high gain.

A further object of the present invention is to provide a linear Class A audio amplifier which draws minimum collector current from the power supply.

Another object of the present invention is to provide a linear Class A audio amplifier which converts DC power to an enlarged reproduction of the essential features of the input signal with a minimum amount of distortion.

Other objects of the invention and nature thereof will become apparent from the following description considered in conjunction with the accompanying drawing.

Generally speaking, the present invention relates to a driver amplifier for an audio amplifier including an amplifying semiconductive means and diode means. The amplifying semiconductive means and the diode means cooperate to provide a gain which is inversely proportional to the gain of a subsequent stage.

Figures 1, 2:
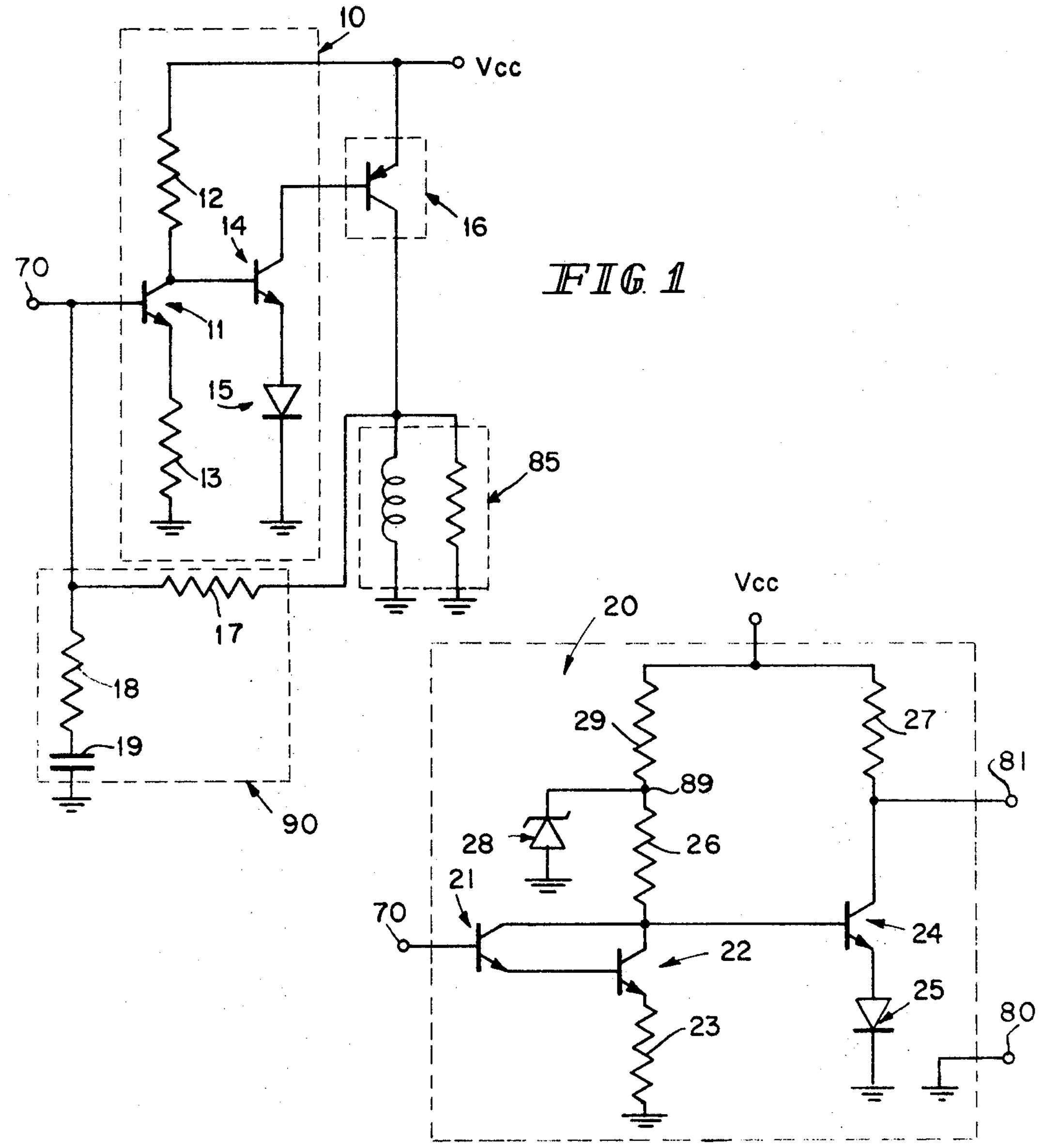
FIG. 1 is a schematic of a linear Class A audio amplifier showing an integrated circuit driver amplifier connected to a single ended power stage.
FIG. 2 is a schematic of an integrated circuit driver amplifier of a linear Class A audio amplifier.

Referring now to FIG. 1 of the drawing, a Class A audio amplifier, the driver amplifier of FIG. 2 and a negative amplifier 10 which is fabricated in integrated form and common emitter power amplifier 16. The driver amplifier includes NPN transistor 11. The NPN transistor 11 has its base connected to input terminal 70. The collector of the transistor 11 is connected to $V_{cc}$ through collector load resistor 12. The emitter of transistor 11 is connected to ground through emitter resistor 13. The voltage gain of transistor 11 may be expressed as the parallel combination of the resistance of the collector load resistor 12 and the input impedance of NPN transistor 14 divided by the dynamic emitter impedance of transistor 11 plus the resistance of emitter resistor 13.

As the base of the NPN transistor 11 of the driver amplifier is driven in the positive direction by the application of an audio input signal to the base of the transistor, a reduction in the collector-to-emitter voltage of transistor 11 is experienced and the transistor conducts more current than it conducted during its quiescent period. It should be seen that a portion of the collector current conducted by transistor 11 is also the base current of NPN transistor 14.

NPN transistor 14 has its base connected to the collector of transistor 11. The emitter of transistor 14 is connected to ground through a diode 15. Diode 15 has its cathode connected to ground and its anode connected to the emitter of transistor 14. The collector voltage of transistor 11 is reduced as the base of transistor 11 is driven in the positive direction thereby reducing the base current of NPN transistor 14 directly connected to the emitter of transistor 11. The reduction of the base current of transistor 14 increases the collector-to-emitter voltage of transistor 14. The increase in the collector-to-emitter voltage of transistor 14 reduces the current which transistor 14 conducts from the level it conducted during its quiescent period. The output signal of the driver amplifier is taken between the collector of transistor 14 and ground, that is, between ground and the collector of transistor 14.

The diode 15 connected between the emitter of transistor 14 and ground cooperates to provide a diode biased output stage which has a gain inversely proportional to the gain of a subsequent power stage 16 driven by the driver amplifier 10. The total current gain of the driver amplifier is, therefore, relatively independent of the power stage beta variations.

The power amplifier 16 includes a PNP power transistor having its base connected to the collector of transistor 14. The emitter of the power transistor is connected to $V_{cc}$. The collector of the power transistor is connected to ground through a suitable load 85 such as an electroacoustic transducer or the like. The collector of the power transistor is also connected to the input terminal through a feedback path including the parallel combination of feedback resistor 17 and the series connected feedback resistor 18 and capacitor 19.

As discussed before, the positive signal at the base of transistor 11 causes a reduction of the base current of transistor 14 and increases the collector-to-emitter voltage of transistor 14. The increase in the collector-to-emitter voltage of transistor 14 reduces the current which flows through the transistor during its quiescent period. The collector current of transistor 14 is the base current of the PNP power transistor of the power amplifier 16. As the base current of the power transistor decreases, an increase in the collector-to-emitter voltage of the power transistor is experienced and the power transistor conducts less current than it conducted during its quiescent period. The current of the power transistor is used to drive the load 85 connected to the collector of the power transistor. It should be noted that a negative going input voltage signal to the base of transistor 11 will cause the currents conducted by transistor 11 to be less than that conducted if the input signal is positive going whereas the current conducted by transistors 14 and 16 would be greater than that conducted if the signal is positive going.

It is seen that the Class A audio amplifier illustrated in FIG. 1 may be considered as a two component amplifier. That is, an amplifier consisting of an integrated circuit driver stage 10 and a power amplifier stage 16. The output signal appearing between the collector and ground of transistor 16 is fed back to the input terminal 70 through a negative feedback network 90 including resistor 17, resistor 18 and capacitor 19. Negative feedback assists in reducing distortion of the output signal. It is seen that the audio, AC, frequencies appearing at the output are attenuated by the capacitor 19 and resistor 17 whereas a DC signal is fed back to the input without attenuation. The amount of signal feedback to the input terminal is determined by the ratio of resistance of resistor 18 to the sum of the resistances of resistors 17 and 18.

The operation of the audio amplifier illustrated in FIG. 1 may be better understood if one assumes that diode 15 is replaced by a suitable resistor similar to that connected to the emitter of transistor 11. The loop gain of the Class A audio amplifier would be dependent, to a large extent, on the beta of the PNP transistor of the power amplifier 16. However, with diode 15 connected between the emitter of transistor 14 and ground, the loop gain is substantially independent of the beta of the PNP transistor of the power amplifier 16. If one assumes that the beta of transistor 16 is very large, a small amount of current is required to flow into the base of the PNP transistor of the power amplifier 16 causing the driver amplifier stage and in particular the combination of transistor 14 and diode 15 to function at a low current. At the low operating current, the dynamic resistance of the diode is quite large thus reducing the gain of the driver amplifier. If one assumes that the gain of the PNP transistor of the power amplifier 16 is low, a large amount of current flow into the base of the PNP transistor of the power amplifier 16 is required and, therefore, a large current flows through transistor 14 and diode 15. At the high current level, the dynamic resistance of diode 15 is small and the gain of transistor 14 is large. In other words, as the gain of the PNP transistor of the power amplifier 16 is varied, the gain of transistor 14 changes in the opposite direction leaving the loop gain substantially constant. A second feature of the combination of the driver amplifier and power stage is its considerable reduction of distortion of the output signal. As the current flow through the PNP power transistor is increased, its gain decreases. However, at the same time the gain of the driver amplifier increases since the dynamic resistance of diode 15 decreases. Thus, the combination of the gain of the driver amplifier and the power amplifier is substantially independent of the operating point of the amplifier thereby producing very little, if any, distortion.

Referring now to FIG. 2 of the drawing, an embodiment of the driver amplifier shown in FIG. 1 is illustrated. The driver amplifier 20 includes NPN transistors 21 and 22 connected so as to form a cascade pair of "Darlington" amplifiers. The NPN transistor 21 has its base connected to input terminal 70. The collector of transistor 21 is connected to the collector or transistor 22. The emitter of transistor 21 is connected to the base of transistor 22. The "Darlington" amplifier further includes an emitter load resistor 23 connected between the emitter of transistor 22 and ground. A collector load resistor 26 is connected to the collectors of transistors 21 and 22. Among other things, the "Darlington" amplifier provides a high input impedance for a driving source such as a discriminator circuit (not shown) which may be connected to the input terminal 70 to thereby minimize distortion of an input waveform such as an audio input signal. The input impedance of the driver amplifier may be approximately expressed as the beta of transistor 21 multiplied by the beta of transistor 22 multiplied by the sum of the resistances of the emitter of transistor 22 and the emitter resistor 23. The input impedance of the driver amplifier is greater than about 50K ohms assuming the respective betas of transistors 21 and 22 are about 30. The input impedance of the driver amplifier will significantly increase as the betas of transistors 21 and 22 increase.

The gain of the "Darlington" amplifier may be expressed as the parallel combination of the resistance of the collector load resistor 26 and the input impedance of transistor 24 divided by the dynamic impedance of transistor 22 and the resistances of emitter resistor 23.

NPN transistor 24 is used as a common emitter amplifier in the driver amplifier. The base of transistor 24 is connected to the collector of transistor 22 of the "Darlington" amplifier. The collector of transistor 24 is connected to the $V_{cc}$ terminal through the bias resistor 27. The emitter of transistor 24 is connected to ground through diode 25. The gain of the common emitter amplifier may be expressed as the ratio of the resistance of bias current resistor 27 to the unbypassed emitter resistance of transistor 24 plus the resistance of diode 25.

The overall open loop gain of the driver amplifier may be expressed as the product of the voltage gains of the "Darlington" amplifier stage and the common emitter amplifier stage.

A Zener diode 28 is connected between current limiting resistor 29 and collector load resistor 26 at point 89. The Zener diode has its anode connected to ground and its cathode connected to point 89. Resistor 29 has one end connected to a power source (not shown) that is, $V_{cc}$. The function of the Zener diode is twofold, that is, for decoupling purposes and to provide stability for the operating point of the driver amplifier. The Zener diode cooperates with the resistors 26 and 29 to maintain point 89 at a substantially constant voltage, that is, at a voltage substantially independent of variations which may be experienced at the $V_{cc}$ terminal.

The audio signal applied to the base of a transistor is amplified by the transistor 21 and then is amplified by transistor 22. When no signal is applied to the base of transistor 21, there may be a voltage drop across emitter resistor 23. The emitter of transistor 23 is, therefore, normally at a potential above gound equal to the voltage drop across resistor 23. As disclosed above, the base of transistor 22 is connected directly to the emitter of transistor 21. The emitter of transistor 21 is, therefore, more positive than the emitter of transistor 22 which, in turn, is more positive than ground.

As the base of NPN transistor 21 is driven in the positive direction by the application of an input signal, such as for example, an audio signal developed in a suitable discriminator circuit (not shown), there is a reduction in the collector-to-emitter voltage of the transistor 21 and the transistor conducts more current than it conducted during its quiescent period. The emitter current conducted by transistor 21 is also the base current of transistor 22. As the emitter current of transistor 21 is driven more positive, because of the reduced voltage drop across the transistor, the base of NPN transistor 22 also becomes more positive. As the base of transistor 22 is driven in the positive direction, the collector-to-emitter voltage of transistor 22 is reduced and the transistor conducts more current. The increase in the current flow through transistor 22 results in an increased voltage drop across the emitter resistor 23. It is seen that the audio signal applied to the base of transistor 11 is amplified by transistors 21 and 22 and now appears across transistor 22 and resistor 23.

The collector voltage of transistor 22 is reduced as the base of the transistor is driven in the positive direction thereby reducing the base current of PNP transistor 24 directly connected to the emitter of transistor 22. The reduction of the base current of transistor 24 increases the collector-to-emitter voltage of transistor 24. The increase in the collector-to-emitter voltage of transistor 24 reduces the current which transistor 24 conducts. The output signal of the amplifier is taken between the collector of transistor 24 and ground, that is, across output terminals 80 and 81.

A diode 25 is connected between the emitter of the transistor 24 and ground. The transistor 24 and the diode 25 cooperate to provide a diode biased output stage which has a gain inversely proportional to the gain of a power stage driven by the driver amplifier. The total circuit gain of the driver amplifier is relatively independent of the power stage beta variations.

Figure 3:
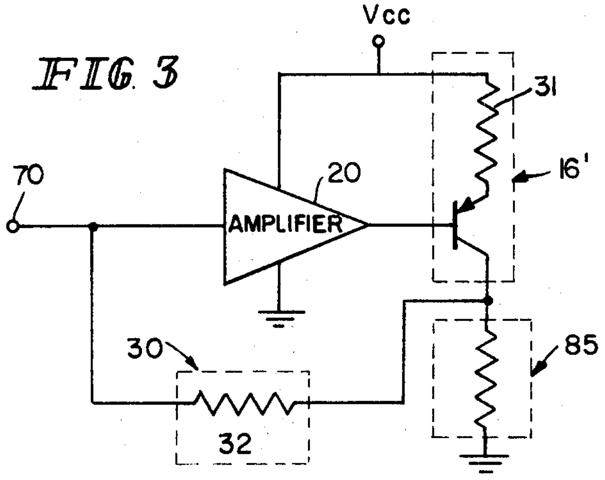
FIG. 3 is a schematic illustrating an output stage of an audio amplifier, the driver amplifier of FIG. 2 and a negative feedback connection.

FIG. 3 shows the driver amplifier 20 having its output connected to the power amplifier 16'. The power amplifier 16' includes the PNP power transistor and a current limiting resistor connected between the emitter of the power transistor and $V_{cc}$. A negative feedback network 30 is connected between the collector of the power transistor and the input to the driver amplifier. The feedback network includes resistor 32. The resistor 32 feeds back AC frequencies and DC current to the input of the driver amplifier.

Figure 4:
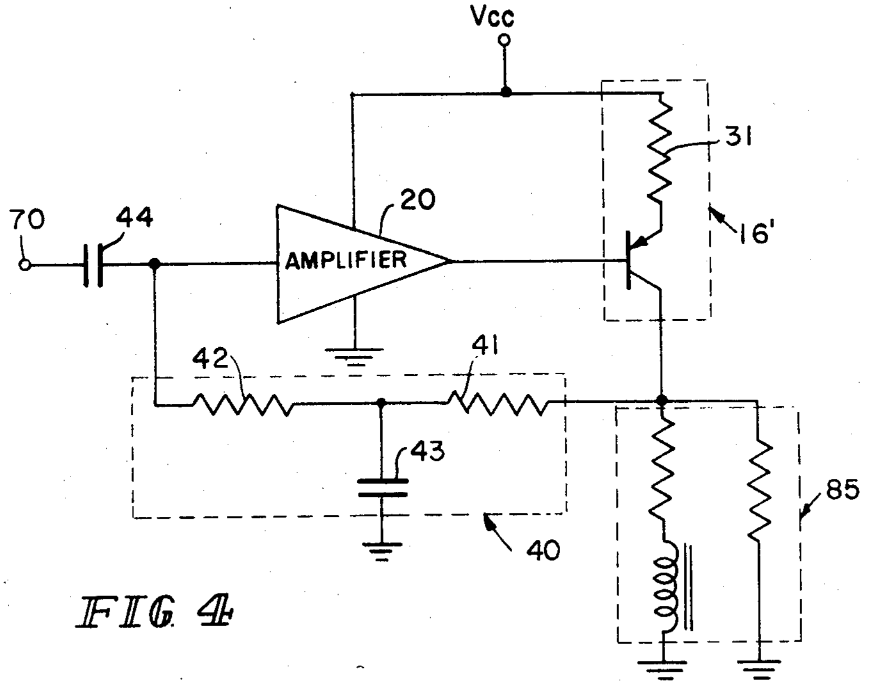
FIG. 4 is a schematic illustrating the output stage of an audio amplifier, the driver amplifier of FIG. 2 and a negative DC feedback connection.

FIG. 4 shows the driver amplifier 20 having its output connected to the power amplifier 16'. A negative feedback network 40 is connected between the collector of the power transistor and the input to the driver amplifier. The feedback network 40 includes serially connected resistors 41 and 42 connected between the power amplifier and the input to the driver amplifier and a capacitor 43 connected between the junction between resistors 41 and 42 and ground. The feedback network feeds back to the input essentially DC current since the capacitor 43 shunts substantially all of the AC frequencies present in the feedback signal to ground. The feedback network 40 is used to stabilize the operating point of the power amplifier. The capacitor 44 serves to DC isolate the driver amplifier from the preceding stage (not shown).

Figures 5, 6:
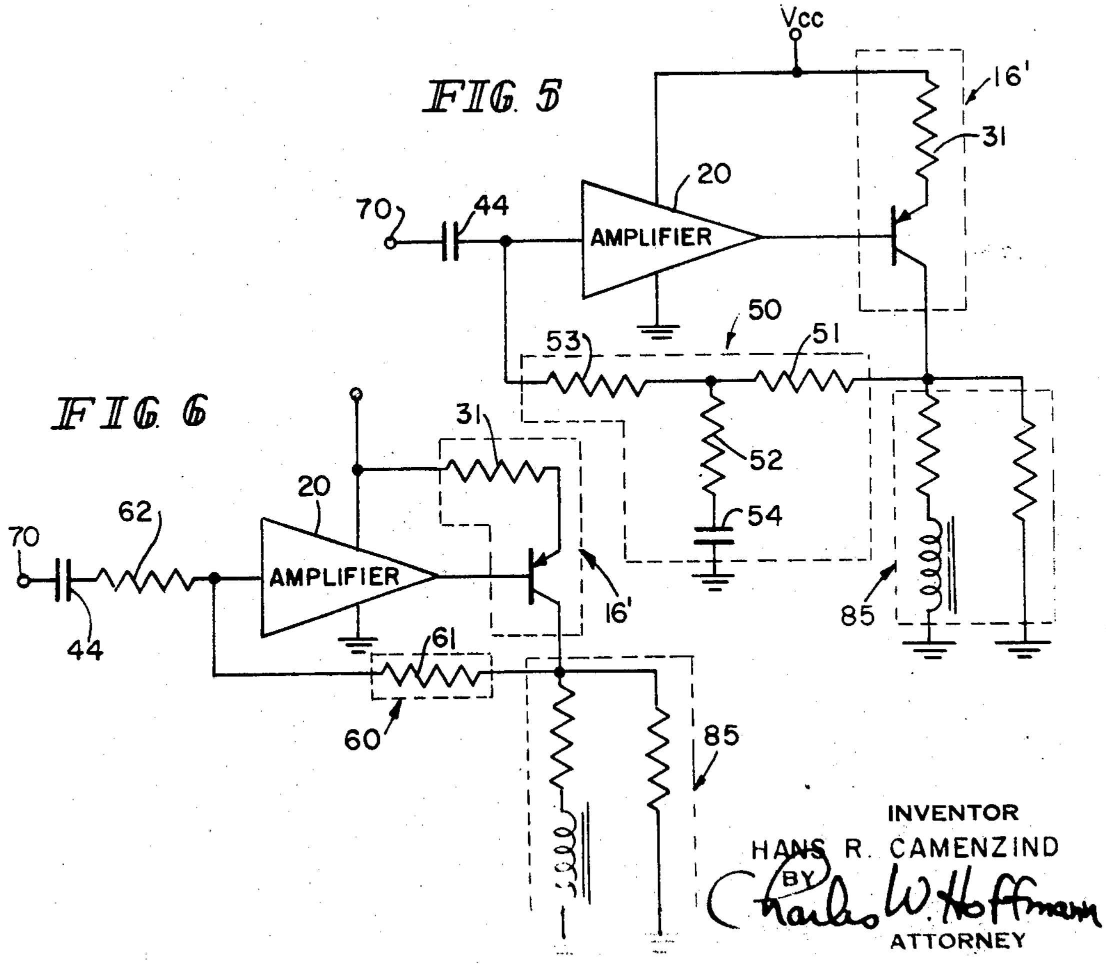
FIG. 5 is a schematic illustrating the output stage of an audio amplifier, the driver amplifier of FIG. 2 and a negative AC and DC feedback path.
FIG. 6 is a schematic illustrating the output stage of an audio amplifier, the driver amplifier of FIG. 2 and a negative AC and DC feedback path.

FIG. 5 illustrates the driver amplifier 20 having its output connected to the power amplifier 16'. A negative feedback network 50 is connected between the collector of the power transistor and the input to the driver amplifier. The feedback network includes serially connected resistors 51 and 53 connected between the power amplifier and the input to the driver amplifier and serially connected resistor 52 and capacitor 54 connected between the junction between resistors 51 and 53 and ground. The feedback network feeds back to the input AC and DC current. The amount of current fed back to the input is determined by the ratio of the resistance of resistor 52 to the sum of the resistances of resistors 51 and 52.

FIG. 6 illustrates the driver amplifier 20 having its output connected to the power amplifier 16'. A negative feedback network 60 is connected to the input of the driver amplifier. The feedback network feeds back AC frequencies and DC current to the input of the driver amplifier through resistor 61. The driver amplifier is separated from the input terminal 70 by serially connected capacitor 44 and resistor 62.

While the invention is illustrated and described in several embodiments, it will be understood that modifications and variations may be effected without departing from the scope of the novel concepts of this invention.

Having thus described my invention, I claim:

1. An improved linear Class A audio amplifier comprised of:

a driver amplifier consisting of:

a first input transistor having a collector, emitter and base, the input of said driver amplifier being connected to the base of said input transistor, an output transistor having a collector, emitter and base, the collector of said input transistor being connected to the base of said output transistor, impedance means connected between the emitter of said input transistor and ground, rectifying means connected between the emitter of said output transistor and ground, impedance means connected between the collector of said input transistor and a voltage supply terminal, and a power amplifier transistor having a collector, emitter and base, the base of said power amplifier transistor being connected to the collector of said output transistor, the emitter of said power amplifier transistor being connected to said voltage supply terminal, load means connected between said collector of said power amplifier transistor and ground, and a feedback network connected between the base of said input transistor and the collector of said power amplifier transistor.

2. The Class A audio amplifier as described in claim 1 wherein:

said load means consists of a network including a combination of resistive and inductive components.

3. A Class A audio amplifier according to claim 1 wherein:

said feedback network includes a combination of resistive and capacitive components.

References Cited

UNITED STATES PATENTS

| | | | |
|---|---|---|---|
| 3,089,968 | 5/1963 | Dunn | 328—142 X |
| 3,287,653 | 11/1966 | Goordman | 330—24 X |
| 3,374,411 | 3/1968 | Karcher | 330—28 X |
| 3,418,591 | 12/1968 | Fisher | 330—28 X |
| 3,436,675 | 4/1969 | Lunau | 330—28 X |

FOREIGN PATENTS

| | | |
|---|---|---|
| 945,109 | 12/1963 | Great Britain. |

ROY LAKE, Primary Examiner

J. B. MULLINS, Assistant Examiner

U.S. Cl. X.R.

330—25, 28, 29

UNITED STATES PATENT OFFICE
CERTIFICATE OF CORRECTION

Patent No. 3,519,946 Dated December 10, 1970

Inventor(s) Hans R. Camenzind

It is certified that error appears in the above-identified patent and that said Letters Patent are hereby corrected as shown below:

3,519,946
CLASS A AUDIO AMPLIFIER
Hans R. Camenzind, Los Altos,
California, assignor to P. R.
Mallory & Co. Inc., Indianapolis,
Indiana, a corporation of Delaware
Filed Sept. 30, 1968, Ser. No. 763,605
Int. Cl. H03g 3/30

U. S. Cl. 330-24 3 Claims

Signed and sealed this 6th day of April 1971.

(SEAL)
Attest:

EDWARD M.FLETCHER,JR.
Attesting Officer

WILLIAM E. SCHUYLER, JR.
Commissioner of Patents